United States Patent [19]

Mayer et al.

[11] Patent Number: 5,053,770
[45] Date of Patent: Oct. 1, 1991

[54] DIGITAL AUTOZERO CIRCUIT OPERABLE IN A PLURALITY OF MODES WITH SEPARATE STORAGE FOR OFFSET CORRECTIONS FOR EACH MODE

[75] Inventors: Eliot Mayer, Tewksbury; Louis R. Poulo, Andover; Jeffrey L. Sauer, Lynn; Hans J. Weedon, Salem, all of Mass.

[73] Assignee: Analogic Corporation, Peabody, Mass.

[21] Appl. No.: 526,067

[22] Filed: May 18, 1990

[51] Int. Cl.$^5$ .............................................. H02J 00/00
[52] U.S. Cl. ................................................... 341/118
[58] Field of Search ............... 341/118, 119, 120, 139, 341/141, 155

[56] References Cited

U.S. PATENT DOCUMENTS

| | | | |
|---|---|---|---|
| 4,163,947 | 8/1989 | Weedon | 328/128 |
| 4,193,066 | 3/1980 | Morrison et al. | 341/118 |
| 4,233,500 | 11/1980 | Cordill | 341/141 |
| 4,364,027 | 12/1982 | Murooka | 341/120 |
| 4,524,346 | 6/1985 | Bosserhoff et al. | 341/118 |
| 4,590,458 | 5/1986 | Evans et al. | 341/118 |
| 4,755,951 | 7/1988 | Hollister | 341/122 X |
| 4,947,168 | 8/1990 | Myers | 341/120 |
| 4,958,139 | 9/1990 | Hyatt | 341/139 X |

Primary Examiner—Howard L. Williams
Attorney, Agent, or Firm—Toby H. Kusmer; Robert J. Schiller

[57] ABSTRACT

An autozero compensation system for autozeroing the output of a data conversion circuit comprising a floating point amplifier and an analog-to-digital converter. The autozero compensation system comprises a source for generating a desired offset voltage, a plurality of digital counters, one for each gain setting of the amplifier, for storing values which are functions of the offset voltages for the gain settings, and a comparator for comparing the output of the A/D converter with the desired offset. Periodically, each of the counters in the autozero circuit is updated for each gain setting by setting the analog input of the amplifier to system ground and the gain of the amplifier set to each of the gain settings, so that the output of the comparator is used to update each of the counters. The outputs of the counters are each converted to analog form by a D/A converter and used to provide the offset correction voltage to the floating point amplifier.

8 Claims, 3 Drawing Sheets

DIGITAL AUTOZERO CIRCUIT OPERABLE IN A PLURALITY OF MODES WITH SEPARATE STORAGE FOR OFFSET CORRECTIONS FOR EACH MODE

FIELD OF THE INVENTION

The present invention relates to apparatus for correcting for drift of the signal output of a circuit caused by temperature variations and other factors, and more particularly to apparatus for autozeroing the signal output of a circuit adapted to operate in one of at least two operating modes, with autozero signals derived and continually updated for each operating mode.

BACKGROUND OF THE INVENTION

In connection with the conversion of an analog signal of a relatively small magnitude to digital form, it is common practice to amplify the signal before conversion. In certain contexts, where the signal must be digitized to a high degree of resolution over a relatively large dynamic range of amplitudes, this amplification is performed using an automatic gain ranging or floating-point amplifier (hereinafter "FPA"), so that the analog input signal can be more accurately resolved with an analog-to-digital converter (hereinafter "ADC") of relatively limited dynamic range by varying the gain setting of the amplifier as a function of the amplitude of the input signal. For example, in CT scan systems comprising X-ray detectors, a high resolution is needed for relatively low level signals provided by the detectors. Hence, the circuit using the ADC to digitally convert the output of the FPA (hereinafter "FPA/ADC circuit") provides digital conversion of analog signals with a relatively higher resolution over a wider dynamic range of amplitudes than the range otherwise permitted by the ADC alone. One type of FPA/ADC, the 10-22126 FPA Module (in conjunction with the 10-22128 data acquisition board) manufactured and sold by the present assignee the Analogic Corporation, includes a plurality of possible fixed gain settings and a decision circuit for selecting the gain level based on the magnitude of the input signal so as to achieve the maximum amplification possible without over ranging the ADC subsequently used to digitize the signal. The signal is converted to a digital signal representing the "mantissa", while the gain setting can be represented in digital form as the "exponent".

Due to temperature variations, circuit parameters, and other factors, however, the output of these FPA/ADC circuits may drift with time, independently of the input signals, creating offset errors. In order for the FPA/ADC to maintain high linearity over its entire input range, the offsets must be matched very closely or cancelled for all of the gain settings. To compensate for such variations, autozeroing circuits (typically comprising a capacitor for storing the analog offset correction signal) have been developed which automatically apply a separate compensation offset voltage for each gain setting of the FPA to compensate for drift errors. The magnitude of each offset voltage is selected so as to cancel each of the drift errors which otherwise would appear in the output of the amplifier at each gain setting when the input to the amplifier is zero.

The analog, capacitive-type, autozero circuit heretofore used in the FPA/ADC circuit suffers from a number of drawbacks. First, a separate capacitor is required for each gain setting by virtue of the fact that different portions of the FPA are utilized for each gain setting. As a consequence of the use of a plurality of separate autozero circuits, cumulative error may develop under certain circumstances. The need to provide a separate autozeroing circuit for each gain setting in the FPA/ADC circuit typically adds to the cost and complexity of manufacture of a FPA/ADC circuit.

A second disadvantage of the analog autozero circuit is that because autozeroing is accomplished in the analog domain, the autozero correction signal itself may drift. If autozero correction is effected with greater frequency so as to minimize the affects of such drift, then circuit performance may be adversely affected since less time is available to digitize the analog information signals provided at the input of the FPA/ADC circuit.

A third drawback of the analog autozero circuit is that the latter involves a circuit design which is essentially limited to FET-input operational amplifiers.

Another type of analog autozero circuit which is known is described in U.S. Pat. No. 4,163,947 issued Aug. 7, 1979 to Hans J. Weedon and assigned to the present assignee. However, this circuit is inappropriate to provide autozero signals for the FPA/ADC circuit.

OBJECTS AND SUMMARY OF THE INVENTION

One object of the present invention is to provide an autozeroing compensating circuit for an FPA/ADC circuit which autozeros the entire FPA/ADC circuit yielding optimum performance.

Another object of the present invention is to provide an autozeroing compensator which minimizes the effects of noise.

Yet another object of the present invention is to provide a digital autozeroing compensator which substantially eliminates the possibility of drift of the autozero correction signal.

Still another object of the present invention is to provide a single autozeroing compensator for an FPA/ADC circuit which autozeros the circuit by a periodically updated value for each gain setting of the FPA/ADC circuit.

These and other objects are achieved by an autozeroing circuit, for generating any one of a plurality of analog offset signals for autozeroing the output of a FPA/ADC circuit operable in a like plurality of modes so that a separate offset signal is provided for each operating mode of the circuit. The compensator comprises:

offset signal means for providing as a function of the operating mode of the circuit the corresponding analog offset signal so as to correct for errors in the output of the FPA/ADC circuit during each of the operating modes, the offset signal means including signal storage means for storing a like plurality of digital signals respectively corresponding to and derived as a function of the analog values of the offset signals for the respective operating modes;

means for generating each of the analog offset signals as a function of the operating mode of the circuit and the corresponding digital signal stored in the signal storage means; and means for periodically updating each of the digital signals stored in the signal storage means so as to correct, when necessary, the value of each of the offset signals.

Other objects of the invention will in part be obvious and will in part appear hereinafter. The invention accordingly comprises the apparatus possessing the construction, combination of elements, and arrangement of parts exemplified in the following detailed disclosure, and the scope of the application of which will be indicated in the claims.

BRIEF DESCRIPTION OF THE DRAWINGS

For a fuller understanding of the nature and objects of the present invention, reference should be made to the following detailed description taken in connection with the accompanying drawings wherein.

DETAILED DESCRIPTION OF THE INVENTION

Figure 1:
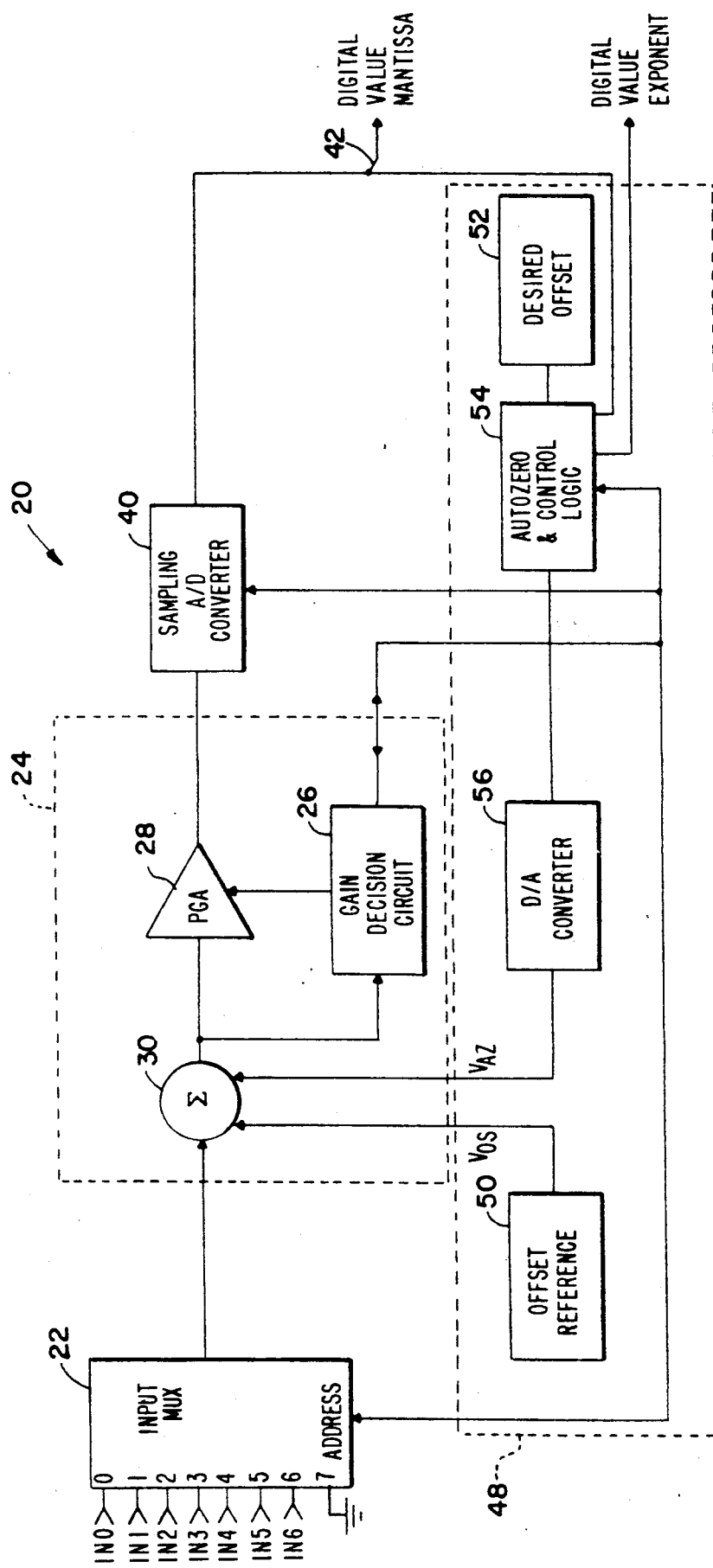
FIG. 1 is a block diagram of a FPA/ADC circuit coupled to the autozeroing circuit of the present invention.

In the drawings the same numerals are used to designate the same or like parts.

Referring to FIG. 1, a FPA/ADC circuit 20, modified in accordance with the present invention, is provided with an FPA 24 and means, in the form of an ADC 40, for converting an analog signal provided at the output of the FPA 24 to a digital output signal. In accordance with the present invention, circuit 20 includes a digital autozero compensator 48 for insuring that any drift in the output of circuit 20 for each gain setting of the FPA 24 remains substantially zero, or some preset value, over time, as described hereinafter, and the response of the FPA 24 and ADC 40 remains substantially free of linearity errors due to offset throughout the entire range provided by the gain settings of the FPA.

In a variety of technological contexts data is acquired in analog form; and in order to process the data the analog signals are converted to their digital equivalent. In many instances the analog signals are of a relatively small magnitude, and yet must be digitized to a high degree of resolution. For instance, the analog output of X-ray detectors used with CT-scan equipment typically varies between one pico amp and one micro amp and must be converted into digital form for subsequent processing. Because of the desire for relatively high resolution, it is common to amplify the analog signals using a floating point amplifier before digitizing the signal. By automatically providing various gain settings depending on the input level of the input signal, the FPA can accurately amplify the input signal over a much larger range than otherwise would be permitted by amplifying the signal with a single gain setting and digitizing the signal. Thus, the FPA is designed to amplify analog input signals of varying magnitude to the greatest extent possible, without over-ranging the ADC used to digitize the amplified signal. The analog output of the FPA can then be digitized by an ADC so as to provide the digital output signal. The digital signal output of the FPA/ADC circuit includes a mantissa representative of the actual signal level digitized and an exponent representative of the gain setting of the FPA. Thus, where the FPA has a possible gain setting of unity, eight or 64, the resolution of the ADC is effectively increased 64 times for low level signals where the gain setting is 64, and eight times for intermediate level signals where the gain setting is eight.

As shown, FPA/ADC circuit 20 comprises an input multiplexer 22 comprising a plurality of pins for receiving a plurality of input signals, e.g. the output of a plurality of X-ray detectors. For the purpose of description, input multiplexer 22 is shown as having seven input pins (pins 0-6) and an eighth pin connected to system ground (pin 7). Of course, the specific number of input pins in multiplexer 22 may vary as dictated by the application of the present invention. Multiplexer 22 also includes an address input for receiving an address signal which determines which input of the multiplexer is connected to the output. The output of multiplexer 22 is provided to FPA 24. In particular, the input signal is applied to a summing circuit 30 of the FPA 24, and adds this signal to the signals $V_{os}$ and $V_{az}$. As will be described in greater detail hereafter: $V_{os}$ is provided by the offset reference 50; $V_{az}$ is provided by the digital autozero compensator 48 forming a portion of the FPA/ADC circuit 20 in accordance with the present invention; and the controller 32 (shown in FIG. 2) of the compensator provides the address signal to the multiplexer.

A gain decision circuit 26 is provided for sensing the level of the summed analog output signal from the circuit 30 and selecting the maximum possible gain of the amplifier which will not over-range ADC 40. Although not described in detail, such gain decision circuits are well known. For example, a set of comparators can be set to provide the three gain settings. Each comparator compares the signal with a DC reference voltage representing the maximum signal allowable in a given gain range. For example, where ADC full scale is 10 V, the signal would be compared with a 1.25 V (or lower) reference to make a decision between gains at eight and one (1.25 V×8=10 V), and with a 0.15625 V (or lower) reference to make a decision between gains eight and 64 (0.15625 V×64=10 V).

Floating point amplifier 24 also includes programmable gain amplifier 28 which consists of a predetermined number, e.g. 3, of gain settings. In the preferred embodiment of the present invention, the amplifier 28 has gain settings of 1, 8, and 64, and is configured to provide an output over the range of 0 to +10 volts. In this way, a sixteen bit output (14 bits representing the mantissa and 2 bits representing the exponent) has equivalent resolution to a 14 bit ADC at a gain setting of one, a 17 bit ADC at a gain setting of eight, and a 20 bit ADC at a gain setting of 64. Gain decision circuit 26 is coupled with programmable gain amplifier 28 so as to ensure a given input signal is amplified as much as possible without over-ranging the ADC 40.

The output of floating point amplifier 24 is provided to ADC 40. ADC 40 is a conventional circuit. In the preferred embodiment of the present invention, ADC 40 is a 16 bit sampling A/D converter, with the input being initially sampled and then converted to digital form during a hold phase. Also in the preferred embodiment, ADC 40 is configured to accept a 0 to +10 volt input, and to provide a 14 bit output on data bus 42 (the 14 most significant bits (MSBs) of the output of ADC 40) representative of the analog input to the ADC 40 (the mantissa output of the FPA/ADC circuit) and a two bit output on the data bus 42 representative of the gain setting of the amplifier 28 for that mantissa value (the exponent output of the FPA/ADC circuit).

The control and timing of the multiplexer 22, FPA 24 and ADC 40 can be provided from the controller 32 of the compensator 48 in a well known manner.

To the extent described thus far, the FPA/ADC circuit using analog, capacitive-type, autozero circuits for storing autozero signals is well known, and for example, is manufactured and sold by the present assignee, Analogic Corporation of Peabody, Mass., as the 10-9981 FPA/ADC Board as a part of a data acquisition system.

In accordance with the present invention an improved digital autozero compensator 48 is provided for improving the accuracy and linearity of the FPA 24 and ADC 40 without utilizing the analog, capacitive-type, autozero circuits and its disadvantages noted above. Compensator 48 includes an offset reference source 50 for generating a predetermined fixed offset voltage $V_{os}$. Offset reference source 50 is coupled to summing circuit 30 so that $V_{os}$ is added to the signal provided by the multiplexer 22. In general, offset signal $V_{os}$ is provided to the signal input of the FPA 24 (regardless of the gain setting of the FPA) for at least two reasons. The data acquisition system architecture providing the input signals to the multiplexer 22 may require that the FPA/ADC circuit have a nominal fixed offset value above zero (assuming as above noted that the FPA and the ADC are configured for 0 to +10 volt input) so as to allow for the linear processing of signals that are slightly below system ground potential. In addition, as will become more evident hereinafter, offset reference source 50 is provided to set a nominal fixed offset to the FPA, minimizing the range requirements of the compensator 48. The accuracy and long term stability of the offset reference source 50 is not critical, since the compensator 48 will correct for any drift in the output of the reference source 50, which also will be more evident from a detailed description of the compensator. If desired, offset reference source 50 may include a voltage divider or other means for permitting initial setting and subsequent adjustment of the voltage $V_{os}$. The nature of the FPA/ADC circuit is such that the actual offset values at any point in time may be different for each gain setting of the FPA since different circuits of the programmable gain amplifier 28 are used depending upon the gain setting.

The remaining portion of the compensator 48 provides a signal $V_{az}$ representative of the continually updated value of the incremental difference between the desired offset value for each gain setting and the actual measured offset value at that gain setting so as to maintain offset stability over time and temperature, and to maintain the linearity of the FPA/ADC circuit through the various gain settings. As shown, the signal $V_{az}$ is added at the summing circuit 30 of the FPA 24 to the signal input received from the multiplexer 22 and the source 50.

In order to generate $V_{az}$ as a continually updated, incremental value for each gain setting, the circuit portion 48 includes the desired offset source 52, autozero and control logic 54, and digital-to-analog (D/A) converter 56, the latter providing the analog value of $V_{az}$. As will be more evident hereinafter, in the preferred embodiment, source 52 provides the desired value of the ADC output for the gain setting of one with zero input, and is multiplied within the autozero and control logic 54 by a factor of one, eight or 64, depending on the gain setting of FPA 24. As will more evident from a description of FIGS. 2 and 3, the output of the offset source 52 is periodically compared to the mantissa output of the ADC 40 for each gain setting of the FPA with the input pin 7 (system ground) of multiplexer 22 being connected to the input of the summing circuit 30.

Briefly described, autozero and control logic 54 is designed to store a digital equivalent of the value of $V_{az}$ for each gain setting. These values are periodically updated. When data, provided on any one of the pins 0-6, is provided through the multiplexer 22, a gain setting is determined by circuit 26. In addition to setting the gain of FPA 24, circuit 26 provides a signal representative of the gain setting to controller 32, which in turn provides the appropriate signal to the other components of autozero and control logic 54. The latter provides a digital signal corresponding to the signal $V_{az}$ for that gain setting. This digital signal is applied to the input of D/A converter 56, wherein the digital value is converted to the signal $V_{az}$ and applied to the summing circuit 30.

Figure 2:
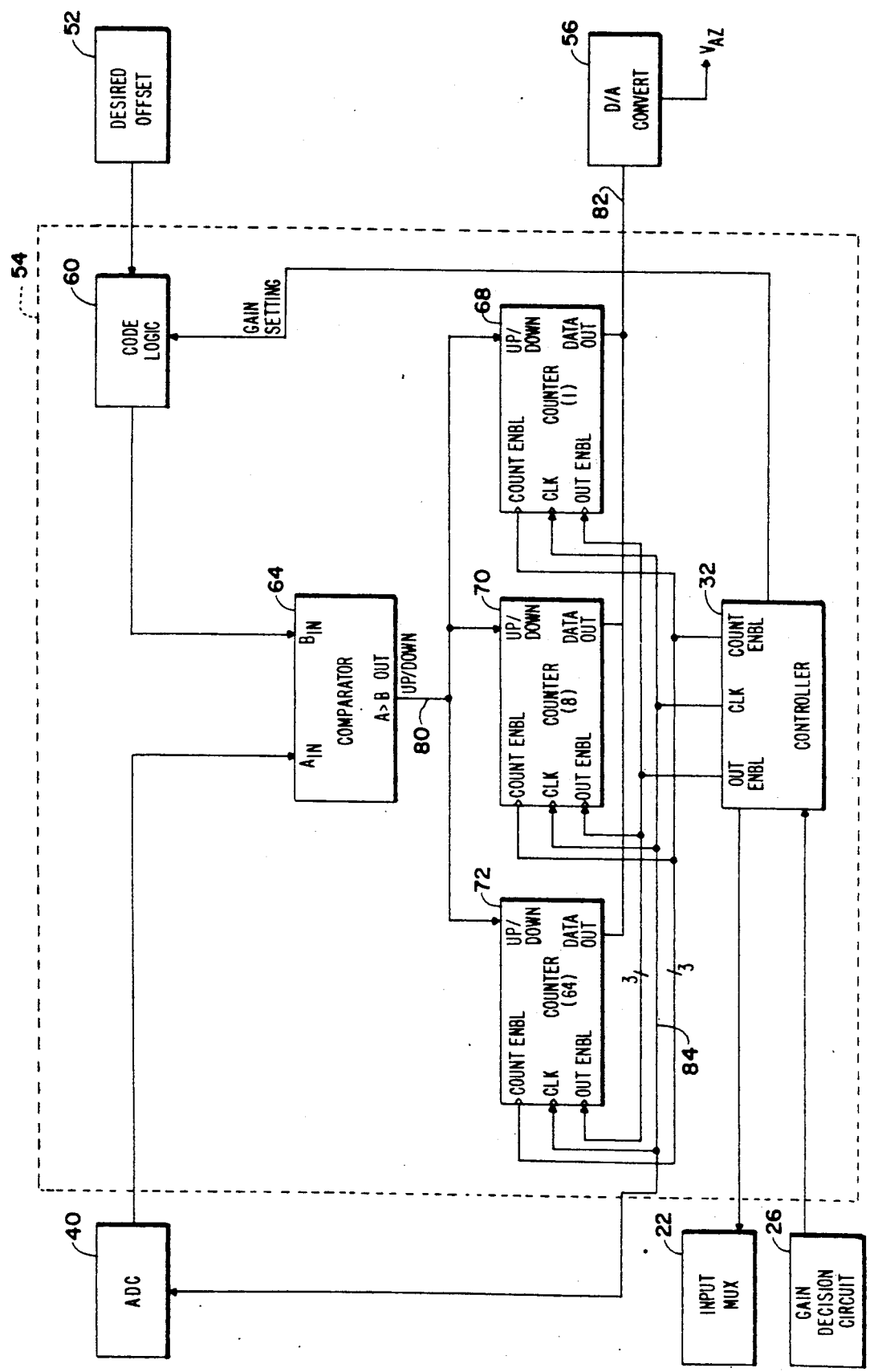
FIG. 2 is a block diagram of the autozero logic portion of the present invention.

As shown in FIG. 2, autozero and control logic 54 includes reference code logic 60 connected to receive the output of desired offset source 52. Reference code logic includes a digital signal multiplier circuit for multiplying the output of the desired offset source 52 (which in the preferred embodiment is the desired offset for unity gain) times each of the possible gain settings of the FPA 24 (in the preferred embodiment this multiplier is either unity, eight or 64), depending upon which offset is being updated. Such multiplication is accomplished, for example, by providing the digital signal from the source 52 in binary form, e.g., an 8 bit signal, and adding three additional "0" bits to the digital number as the least significant bits (LSBs) so as to create a multiplication factor of eight, and six additional "0" bits to the digital number as the LSBs so as to create a multiplication factor of 64.

The basis for the particular gain setting multiplication factor is provided to the controller 32 by the gain decision circuit 26. The controller controls the reference code logic 60, the D/A converter 56 and other components of the autozero and control logic 54. As will be described in greater detail hereinafter, all of the offsets for the respective gain settings are intermittently sampled and updated in a predetermined sequence, each update of the value of $V_{az}$ for a particular gain setting occurring between two time periods when data is processed through the FPA/ADC circuit 20.

As shown, the output of the reference code logic 60 is applied to one input of a digital comparator 64. The latter has its other input connected to the output of the ADC 40 so that the comparator will compare the actual offset during a particular update sampling period with the desired offset applied by source 52 through logic 60.

Comparator 64 is a conventional digital comparator for comparing the magnitude of two digital signals, and for generating an UP/ (increment) low active signal if the output of ADC is of a greater value than the output of the logic 60, and a DOWN (decrement) high active signal if the ADC output is of a value less than the logic output. In the preferred embodiment of the present invention, comparator 64 is a fifteen bit comparator providing a one bit output.

Autozero and control logic 54 additionally comprises a plurality of counters, one for each gain level setting of programmable gain amplifier 28. Specifically, each of the counters is used to store the updated digital value of the $V_{az}$ signal for the corresponding respective gain setting of amplifier 28. Coincidentally, each counter also functions as a digital filter, as described below. In the preferred embodiment of the invention illustrated in FIG. 2, autozero and control logic comprises one counter for each gain setting of FPA 24: counter 68 for the unity gain setting, counter 70 for the gain setting of eight, and counter 72 for the gain setting of 64.

Preferably, although not necessarily, fourteen bit counters are used for counters 68 and 70, and a 16 bit counter is used for counter 72. Only the twelve MSBs of the output of each counter are used to generate the $V_{az}$ signal. Since the twelve MSBs of the output of the fourteen bit counters 68 and 70 are used, the latter each have two extra stages (four counts up or down are required between each incremental value of the output). Similarly, since the twelve MSBs of the output of the sixteen bit counter 72 are used, the latter has four extra stages (sixteen counts up or down are required between each incremental value of the output). Circuit noise which causes flickering of the least significant bit (LSB), or bits, will cause a particular counter to alternately increment and decrement. However, this will have a minimal effect on the output of the counter since the LSB is not read out of the counter when the particular value of $V_{az}$ is needed. Thus, each of the counters 68, 70 and 72 performs a digital filtering function, by minimizing the effects of circuit noise generated by floating point amplifier 24 and ADC 40. In this regard the resolution of D/A converter 56 should be high enough to minimize noise due to quantization errors.

As shown in FIG. 2, the output of comparator 64 is provided on line 80 to the increment/decrement input of counters 68, 70 and 72. The data output terminals of comparators 68, 70 and 72 are coupled via line 82 to D/A converter 56. Each of counters 68, 70 and 72 includes a clocking input connected via line 84 to controller 32 so that the latter provides a clocking signal to each counter. Each of the counters 68, 70 and 72 is selectively enabled at the respective count enable inputs of the counters by the controller 32 of logic 54 in a predetermined sequence described hereinafter in connection with FIG. 3. During each autozero period the particular counter that is enabled will increment or decrement on each clocking pulse depending upon whether a UP/ or DOWN signal is provided by the comparator to the increment/decrement input of the enabled counter when the counter is clocked at the clocking input by an ADC trigger signal.

Each counter also includes an output enable input for receiving an output enable signal from the controller 32 so as to provide the currently stored value in each counter to be read at the data output of the counter. Thus, during the periods of time when data received at the input pins 0 through 6 of the multiplexer is processed by the FPA/ADC circuit 20, as well as during the autozero periods, the current digital value of the signal $V_{az}$ can be read out of the appropriate counter, 68, 70 or 72 depending on the gain setting of the FPA.

Figure 3:
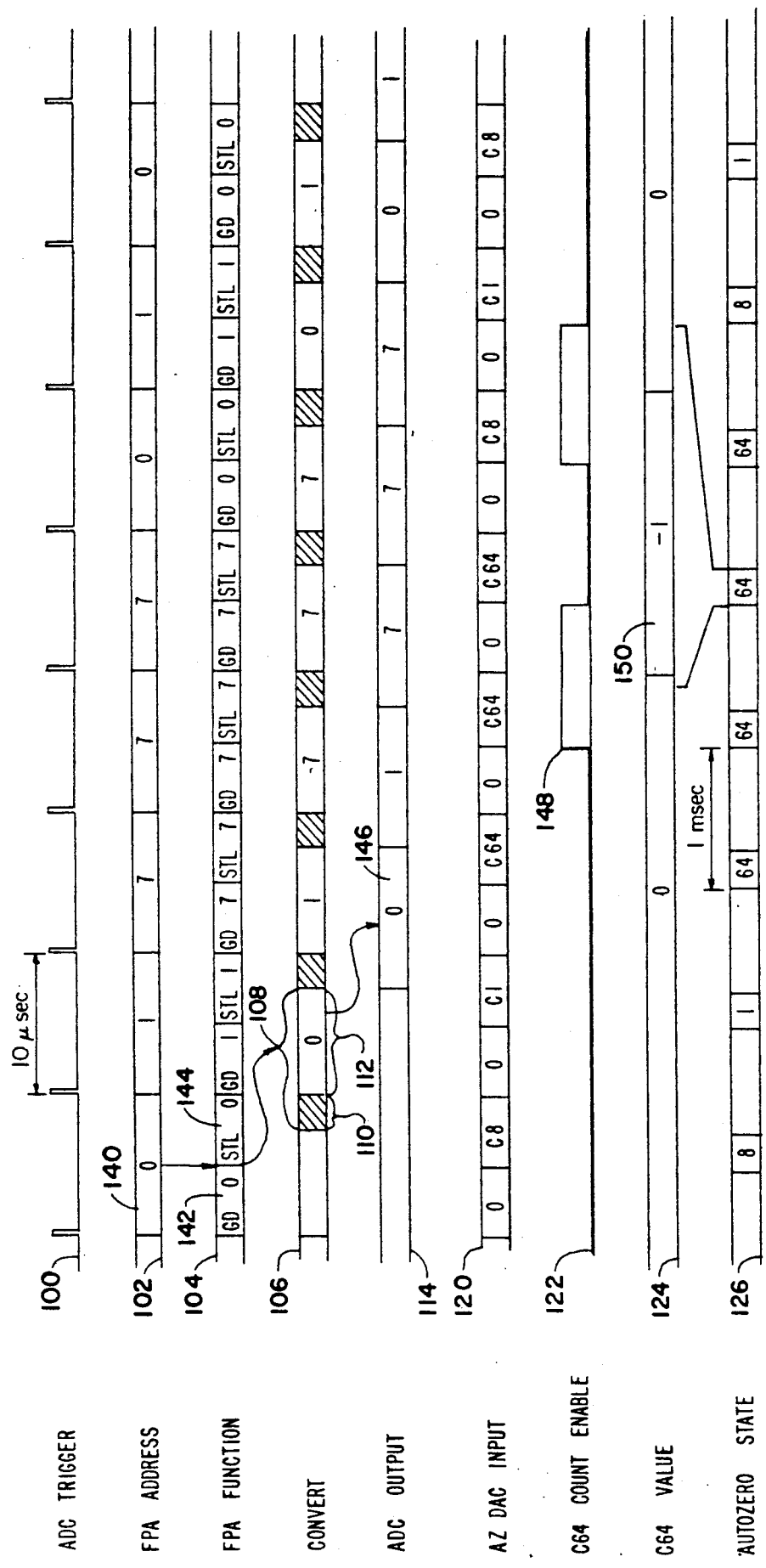
FIG. 3 is a timing diagram of the autozeroing circuit of the present invention.

In connection with the following discussion of (1) the timing of circuit 20, and (2) additional functions performed by controller 32 of logic 54, reference should be made to FIGS. 1-3. Referring specifically to the timing diagram illustrated in FIG. 3, the first line, line 100 shows the frequency with which controller 32 provides clocking pulses to ADC 40. Upon receipt of each such pulse, ADC 40 holds the analog input provided at its input, converts the sampled input into digital form; whereupon ADC 40 then samples the next signal.

Line 102 indicates which of the inputs of multiplexer 22 is being addressed, at various points in time, and is largely dependent upon the data acquisition system with which the FPA/ADC circuit 20 is used. For simplification of description, only inputs 0, 1 and 7 of multiplexer 22 are shown addressed.

Line 104 indicates the function being accomplished by FPA 24. As used in line 104, GD0 means a gain decision is being made for the input provided on the zero input pin of multiplexer 22, STL0 represents the time period during which FPA 24 settles after amplifying an input received at the zero input pin. Similarly, GD1 and GD7 represent the corresponding time periods when a gain decision is being made for inputs received at the input pins 1 and 7 of multiplexer 22, respectively, and STL 1 and STL 7 represent the corresponding time periods during which FPA 24 settles after amplifying inputs received at the input pins 1 and 7, respectively.

Line 106 represents the time during which ADC 40 is converting an analog signal to a digital signal. In line 106, during the time period identified as 108, the analog signal at the input pin of the multiplexer 22, indicated, as 0, 1 or 7, is sampled and then converted to a digital signal. Specifically, each time period 108 includes a sampling period 110, and a conversion period 112.

FIG. 3 also shows line 114 which identifies the time period during which the output of ADC 40 is being provided. Each time period identified on line 114 includes an identification of the input pin of multiplexer 22 from which the analog input signal being converted is received. Each output of ADC 40 identified on line 114 is provided beginning at the end of the analog to digital conversion. Thus, the digital conversion for a given analog input is provided immediately following completion of the analog to digital conversion, i.e., at the end of time period 112 shown, on line 106.

Line 120 in FIG. 3 indicates the period of time that a counter 68, 70 or 72 receives a signal at its output enable input, and whose output is being used in the generation of the corresponding $V_{az}$ signal. As used in line 120, zero is a null state indicating no digital code is being provided by any of the counters, C1 indicates the output of counter 68 is being used, C8 indicates the output of counter 70 is being used, and C64 indicates the output of counter 72 is being used.

Line 122 indicates when a count enable signal is provided by controller 32 to count enable input of counter 72. Line 124 indicates the change in value of counter 72, i.e. whether counter 72 is being incremented, decremented, or not changed. For purposes of description, the count enable state and count value state, represented by lines 122 and 124, have been provided in FIG. 3 for only counter 72. As those of ordinary skill in the art will appreciate, similar count enable and count values occur with counters 68 and 70.

FIG. 3 also includes an autozero state line 126 which indicates the sequence and timing of which of the counters 68, 70, and 72 is being autozeroed. As shown the counters are updated on a modulo-6 basis. Specifically, since the counter 72 has two more stages than counters 68 and 70, counter 72 is four times slower to respond to offset changes. To compensate for this, counter 72 is autozeroed four times as often in the sequence as counters 68 and 70.

In connection with the following description of an A/D conversion and an autozeroing cycle, it is assumed an analog input signal is provided at input pin 0 of multiplexer 22. After controller 32 has addressed input pin 0 of multiplexer 22, as indicated by time period 140 on line 102 of FIG. 3, the input signal is provided to summing circuit 30. There, $V_{os}$ is added to the analog input signal. As noted above, $V_{os}$ is provided to ensure that only positive inputs are provided to the ADC 40, and to limit the range requirements of the autozero components of compensator 48 and in particular counters 68, 70 and 72, and the D/A converter 56.

Next, gain decision circuit 26 evaluates the input signal to the amplifier 28 and sets the gain of the amplifier such that the input signal is maximally amplified without over ranging ADC 40. This gain setting is provided to the controller 32, which in turn provides the output enable signal to the appropriate one of the counters 68, 70 and 72 depending on the selected gain of the amplifier 28. Thus, if the gain selected is unity, counter 68 is enabled. Similarly, a gain setting of 8 results in counter 70 being enabled and a gain setting of 64 results in counter 72 being enabled. This allows the current count in the enabled counter to be provided on the data bus 82 to the D/A converter 56, whereupon the signal is converted to the analog signal $V_{az}$. The latter is applied to circuit 30 and added to the analog input signal received from the multiplexer 22 and the $V_{os}$ signal received from offset reference source 50. Amplifier 28 amplifies the combined signal provided from the circuit 30 at the selected gain level. The gain decision is finalized, and counter outputs enabled, at the end of time period 142 in line 104 of FIG. 3. Thereafter, as indicated by time period 144 in line 104, amplifier 28 and D/A converter 56 are allowed to settle.

At the termination of the settle period identified by time period 144, ADC 40 holds and begins converting the analog input signal into digital form, as indicated by the first time period 112 in line 106. This conversion is a two-step process, as noted above. The first step involves sampling the output signal of the amplifier 28. This sampling occurs during the first part of time period 108, i.e. time period 110. The second step, as indicated by time period 112, is a hold period where actual conversation of the analog input signal to digital form occurs.

At the termination of conversion period 112, ADC 40 provides the digital signal on output line 42 (FIG. 1), representative of the analog input signal, as indicated by time period 146 on line 114.

Each data sampling period of the ADC occurs, for example, every 1.0 millisecond. During a small time period after each sampling period, e.g., 30 microseconds, controller 32 directs autozero and control logic 54 to perform an autozeroing operation. During each autozeroing operation the value stored in one of the counters 68, 70 and 72 is updated with the operation. The counters are updated in the sequence described on line 126, for example, by updating counter 72 four consecutive times, then updating counter 70 and counter 68, each once, over respectively six consecutive autozero periods, before repeating the sequence. During the time period of each autozero cycle, controller 32 addresses the multiplexer 22 so as to connect input pin 7 to the output, with the result that the input to the summing circuit from the multiplexer is connected to system ground. In addition, depending upon the cycle, the appropriate gain setting of the amplifier is set with a gain of 64, eight or unity depending upon the state of line 126. If, for example, the autozero cycle is being carried out for a gain setting of 64, both the amplifier 28 and reference code logic 60 are each set for a gain of 64. In addition controller 32 provides the output enable signal to the counter 72 so as to provide the present count on the data bus 82 to the D/A converter 56. The latter, in turn, provides the analog signal $V_{az}$ for the gain 64 to the summing circuit 30. The 14 bit mantissa portion of the output of ADC 40 is therefore a digital value representative of the grounded input to summing circuit 30 from the multiplexer 22, and the sum of the values of $V_{os}$ and $V_{az}$ for the gain setting of 64 based on the last updated value in counter 72. During the autozero cycle, comparator 64 compares the magnitude of the digital value provided by ADC 40 with the magnitude of the digital value provided by reference code logic 60 which is determined by the desired offset source 52.

The value of the count in counter 72 is now ready to be updated. Only counter 72 will then receive the count enable signal from controller 32. If the output value of ADC 40 is greater than the output value of logic 60, the total offset is greater than it should be. Accordingly, the comparator will provide a DOWN signal at its output to the increment/decrement input of the counter so as to reduce the count in counter 72 by one. Similarly, if the output value of ADC 40 is less than the output value of logic 60, the total offset is less than it should be. Accordingly, in the latter instant, comparator 64 will provide an UP/ signal at its output to the increment/decrement input of the counter so as to increase the count in counter 72 by one. As described above, each incremental value of the twelve bit output of counter 72 represents sixteen UP/or DOWN signals at the input of the counter, while each incremental value of the twelve bit output of the counter 68 and 70 represents four UP/ or DOWN signals at the input of each of those counters.

Following each autozero cycle the circuit processes the next samples of data received at one or more of input pins 0-6. Following that sampling, the autozero cycle is performed for the next gain setting in the modulo-6 sequence established by the controller 32. In this way the counters 68, 70 and 72 are periodically updated with the value of the signal $V_{az}$ applied to the circuit 30 for each gain setting. Counters 68 and 70 are thus updated in a similar manner to that described for counter 72.

Thus, an important advantage of the present invention is that the offset voltage $V_{az}$ is stored for each gain setting of the FPA/ADC circuit in digital form in counters 68, 70 and 72. As a result, while the offset voltage might otherwise drift, the value of $V_{az}$ for each gain setting can be continually adjusted to compensate for the drift. Furthermore, by providing extra stages in counters 68, 70, and 72, a consistent imbalance between the actual output of FPA/ADC 20 and the desired output is required before the $V_{az}$ values stored in and provided by counters 68, 70, and 72 are changed. As such, circuit noise will have very little affect on the value of offset voltage $V_{az}$.

Since certain changes may be made in the above device without departing from the scope of the invention herein involved, it is intended that all matter contained in the above description as shown in the accompanying drawing shall be interpreted in an illustrative and not in a limiting sense.

What is claimed is:

1. An autozero compensator in combination with a data conversion circuit, operable in a plurality of modes, for digitizing an analog signal as a function of the sum of said analog input signal and one of a plurality of different first analog offset signal provided respectively for each of said modes, said compensator comprising, in combination, means for generating a plurality of desired digital offset signals, each corresponding to one of said modes;

signal comparison means for periodically comparing each of said desired offset signals with the output of said conversion circuit so as to generate a like plurality of digital corrections signals, said conversion circuit being set to operating in a corresponding one of said modes and having its input connected to system ground;

means for storing said digital correction signals;

means for periodically updating each of said digital correction signals stored in said signal storage means in response to the period comparison of said desired offset signals to said output of said conversion circuit;

digital-to-analog converter means for converting each of said stored digital signals to a corresponding autozero analog signal as a function of the corresponding operating mode; and means for altering said sum responsively to each of said autozero analog signals so as to autozero said conversion circuit for each of said corresponding modes.

2. An autozero compensator according to claim 1, wherein said data conversion circuit includes an analog input for receiving said analog input signal, a digital output for providing a digital output signal as a function of said sum, means for selecting the operating mode of said circuit, and means for generating said analog offset signals in accordance with the respective operating mode selected; and wherein said means for periodically updating each of said digital correction signals includes means for coupling said analog input to system ground, said means for generating said desired digital offset signals provides respectively predetermined values of each of said digital offset signals for each of said operating modes; and said signal comparison means includes means for generating comparison signals as a function of the relative magnitudes of each of said desired digital offset signals compared with the digital output signal of said circuit when said analog input is coupled to system ground and the corresponding analog offset signal is generated for each of said operating modes, and said means for periodically updating each of said digital correction signals is responsive to a function of said difference signal.

3. An autozero compensator according to claim 2, wherein said means for selecting the operating mode of said circuit selects said operating mode in accordance with a predetermined sequence.

4. In a data conversion circuit operable in a plurality of modes and comprising an input for receiving an analog input signal, an analog-to-digital converter for digitizing said analog signal as a function of the sum of said analog input signal and one of a plurality of different first analog offset signals provided respectively for each of said modes, means for detecting the level of said analog input signal, a programmable gain amplifier having its output coupled to the input of said converter, and means for setting the gain of said amplifier at one of at least two gain settings as a function of the detected level of said analog input signal so that said amplifier is set for maximum gain for the detected level of said analog input signal such that said amplifier will not over-range said converter and the response of said amplifier is substantially linear throughout the dynamic range of said amplifier at said gain settings, said circuit further comprising:

means for generating a plurality of desired digital offset signals, each corresponding to one of said modes;

means for comparing said desired offset signals with the output of said conversion circuit having its input grounded so as to generate a like plurality of digital correction signals;

means for storing said digital correction signals;

means for periodically updating each of said digital correction signals stored in said signal storage means;

digital-to-analog converter means for converting each of said stored digital signals to an autozero analog signal as a function of said operating mode; and means for altering said sum responsively to said autozero analog signal so as to autozero said conversion circuit for each of said operating modes.

5. An autozero compensator according to claim 4, wherein said means for selecting the gain setting of said amplifier selects said gain setting in accordance with a predetermined sequence.

6. A circuit according to claim 4, wherein said signal storage means comprises a plurality of digital counters, one for each of said gain settings of amplifier, and connected so as to be responsive to said means for updating.

7. A circuit according to claim 6, including controller means coupled to said means for comparing and to each of said plurality of counters, for enabling the counter corresponding to the gain setting of said amplifier when said corresponding counter is updated by said means for updating said digital correction signal, so that said corresponding counter is incremented so as to increase the magnitude of said digital correction signal responsively to said comparator means when said desired digital offset signal is greater than said digital output signal of said data conversion circuit and is decremented so as to decrease the magnitude of said digital correction signal responsively to said comparator means when said desired digital offset signal is less than said digital output signal of said data conversion circuit.

8. A circuit according to claim 6, wherein each of said counters contain a predetermined number of stages for storing each of said digital correction signals as a predetermined number of bits, wherein said means for converting each of said stored digital signals to an autozero analog signal includes means for using fewer than said predetermined number of stages of the corresponding counter so as to provide a predetermined number of most significant bits of said digital signal stored in said corresponding counter and minimize noise effects on the count stored in each of said counters.

* * * * *

UNITED STATES PATENT AND TRADEMARK OFFICE
CERTIFICATE OF CORRECTION

PATENT NO. : 5,053,770

DATED : October 1, 1991

INVENTOR(S) : Mayer, Eliot et al.

It is certified that error appears in the above-identified patent and that said Letters Patent is hereby corrected as shown below:

Claim 1, column 11, line 2, delete "signal" and substitute therefor --signals--.

Claim 1, column 11, line 11, delete "corrections" and substitute therefor --correction--.

Signed and Sealed this

Twenty-fifth Day of May, 1993

Attest:

MICHAEL K. KIRK

*Attesting Officer*   *Acting Commissioner of Patents and Trademarks*